(12) United States Patent
Hemley et al.

(10) Patent No.: US 8,246,746 B2
(45) Date of Patent: Aug. 21, 2012

(54) LASER USES FOR SINGLE-CRYSTAL CVD DIAMOND

(75) Inventors: Russell J. Hemley, Washington, DC (US); Ho-Kwang Mao, Washington, DC (US); Chih-Shiue Yan, Washington, DC (US)

(73) Assignee: Carnegie Institution of Washington, Washington, DC (US)

( * ) Notice: Subject to any disclaimer, the term of this patent is extended or adjusted under 35 U.S.C. 154(b) by 1178 days.

(21) Appl. No.: 12/010,613

(22) Filed: Jan. 28, 2008

(65) Prior Publication Data

US 2008/0205456 A1   Aug. 28, 2008

Related U.S. Application Data

(60) Provisional application No. 60/897,838, filed on Jan. 29, 2007.

(51) Int. Cl.
  *C30B 29/04*   (2006.01)
(52) U.S. Cl. .............. 117/89; 117/94; 117/95; 117/929; 423/446
(58) Field of Classification Search ............. 117/89, 117/94, 95, 98, 104, 929; 423/446
  See application file for complete search history.

(56) References Cited

U.S. PATENT DOCUMENTS

| 5,099,788 | A | 3/1992 | Ito et al. ............. 118/666 |
| 5,209,182 | A | 5/1993 | Ohta et al. ........... 118/666 |
| 5,420,879 | A | 5/1995 | Kawarada et al. ...... 372/41 |
| 5,704,976 | A | 1/1998 | Snail ................ 117/98 |
| 6,574,255 | B1 | 6/2003 | Caprara et al. ........ 372/45.01 |
| 6,667,999 | B2 | 12/2003 | Hasson et al. ........ 372/36 |
| 6,858,078 | B2 | 2/2005 | Hemley et al. ......... 117/68 |
| 2003/0084839 | A1* | 5/2003 | Hemley et al. ........ 117/201 |
| 2004/0169178 | A1 | 9/2004 | Okushi et al. |
| 2005/0163169 | A1* | 7/2005 | Lawandy et al. ...... 372/3 |
| 2007/0157875 | A1 | 7/2007 | Hemley et al. ....... 117/104 |
| 2007/0196263 | A1 | 8/2007 | Hemley et al. ....... 423/446 |

FOREIGN PATENT DOCUMENTS

| EP | 0732784 | 9/1996 |
| EP | 1553215 | 7/2005 |
| EP | 1555337 | 7/2005 |
| EP | 1632590 | 3/2006 |
| WO | WO 92/00800 | 1/1992 |
| WO | WO 01/31082 A1 | 3/2003 |
| WO | WO 2006/127611 | 11/2006 |

OTHER PUBLICATIONS

A. Afzal et al., "HFCVD Diamond Grown With Added Nitrogen: Film Characterization and Gas-Phase Composition Studies", Diamond and Related Materials, pp. 1033-1038 (1998).

(Continued)

*Primary Examiner* — Bob M Kundemund
(74) *Attorney, Agent, or Firm* — Morgan Lewis & Bockius LLP

(57) ABSTRACT

The present invention is directed to new laser-related uses for single-crystal diamonds produced by chemical vapor deposition. One such use is as a heat sink for a laser; another such use is as a frequency converter. The invention is also directed to a $\chi^{(3)}$ nonlinear crystalline material for Raman laser converters comprising single crystal diamond.

6 Claims, 2 Drawing Sheets

OTHER PUBLICATIONS

A. Chayahara et al., "The effect of nitrogen addition during high-rate homoepitaxial growth of diamond by microwave plasma CVD", Diamond & Related Materials, 13, pp. 1954-1958 (2004).

A. Tallaire et al., "Oxygen plasma pre-treatments for high quality homoepitaxial CVD diamond deposition", Phys. Stat. Sol., (A), 201, No. 11, pp. 2419-2424 (2004).

A.T. Collins, "Vacancy enhanced aggregation of nitrogen in diamond", J. Phys. C: Solid St. Phys., 13, pp. 2641-2650 (1980).

Alan T. Collins et al., "Color changes produced in natural brown diamonds by high-pressure, high-temperature treatment", Diamond and Related Materials, 9, pp. 113-122 (2000).

B.V. Spitsyn et al., "Vapor Growth of Diamond on Diamond and Other Surfaces", Journal of Crystal Growth, 52, pp. 219-226 (1981).

C. S. Yan et al., "Ultrahard diamond single-crystals from chemical vapor deposition", Physica Status Solidi, (a), 201, pp. R24-R27 (2004).

C. S. Yan et al., "Very high growth rate chemical vapor deposition of single-crystal diamond", Proceedings of the National Academy of Science, 99 (20), pp. R25-R27 (2002).

C. Wild et al., "Oriented CVD diamond films: twin formation, structure and morphology", Diamond and Related Materials, 3, pp. 373-381 (1994).

C.F.O Graeff et al. "Optical excitation of paramagnetic nitrogen in chemical vapor deposited diamond", Applied Physics Letters, vol. 69, No. 21, pp. 3215-3217 (1996).

Chih-Shiue Yan et al., "Multiple Twinning and Nitrogen Defect Center in Chemical Vapor Deposited Homoepitaxial Diamond", Diamond and Related Materials, 8, pp. 2022-2031 (1999).

Chih-Shiue Yan et al., "Very high growth rate chemical vapor deposition of single-crystal diamond", Proc. Natl. Acad. Sci. USA, 99, pp. 12523-12525 (2002).

Dr. R.S. Sussmann, "A New Diamond Material for Optics & Electronics", IDR 2/93 New Products. pp. 63-72.

G.Z. Cao et al., "Growth of {100} Textured Diamond Films by the Addition of Nitrogen", Journal of Applied Physics, vol. 79, No. 3, pp. 1357-1364 (1996).

H. Kitawaki et al., "Identification of CVD synthetic Diamond, Gemmological Association of all Japan", Research Laboratory Report (Mar. 15, 2005).

I. Sakaguchi et al., "Suppression of surface cracks on (111) homoepitaxial diamond through impurity limination by oxygen addition", Appl. Phys. Lett., 73, pp. 2675-2677 (1998).

J. Isberg et al., "High carrier mobility in single-crystal plasma-deposited diamond", Science, 297, pp. 1670-1672 (2002).

J. te Nijenhuis et al., "Red luminescence in phosphorous-doped chemically vapor deposited diamond", Journal of Applied Physics, vol. 82 (1), pp. 419-422 (1997).

Jean-Pierre Vitton et al., "High Quality Homoepitaxial Growth of Diamond Films", Diamond and Related Materials, pp. 713-717 (1993).

Ji-an Xu et al., "Moissanite: A Window for High-Pressure Experiments", Science, 290, pp. 783-785 (2000).

M. Schreck et al., "Diamond Nucleation on Iridium Buffer Layers and Subsequent Textured Growth: A Route for the Realization of Single-Crystal Diamond Films", Applied Physics Letters, vol. 78, No. 2, pp. 192-194 (2001).

M.A. Tamor et al., "On the role of penetration twins in the morphological development of vapor-grown diamond films", Journal of Materials Research, vol. 9, No. 7, pp. 1839-1848 (1994).

Mikka Nishitani-Gamo et al., "Confocal Raman spectroscopic observation of hexagonal diamond formation from dissolved carbon in nickel under chemical vapor conditions", Applied Physics Letters, vol. 73, No. 6, pp. 765-767 (1998).

Mutsukazu Kamo et al., "Diamond Synthesis From Gas Phase in Microwave Plasma", Journal of Crystal Growth, 62, pp. 642-644 (1983).

O. A. Williams et al., "High growth rate MWPECVD of single crystal diamond", Diamond & Related Materials, 13, pp. 557-560 (2004).

P. M. Martineau et al., "Identification of synthetic diamond grown using chemical vapor deposition (CVD)", Gems & Gemology, vol. 60, pp. 2-25 (2004).

R.E. Stallcup II et al., "Scanning Tunneling Microscopy Studies of Temperature-Dependent Etching of Diamond (100) by Atomic Hydrogen", Physical Review Letters, vol. 86, No. 15, pp. 3368-3371 (2001).

S. J. Charles et al., "Characterization of nitrogen doped chemical vapor deposited single-crystal diamond before and after high pressure, high temperature annealing", Physica Status Solidi (a), pp. 1-13 (2004).

S. J. Harris et al., "Effects of oxygen on diamond growth", Appl. Phys. Lett., vol. 55 No. 21, pp. 2179-2181 (1989).

S. Jin et al., "Effect of Nitrogen on the Growth of Diamond Films", Applied Physics Letters, vol. 65, No. 4, pp. 403-405 (1994).

S. Woddring et al., "Guide to laboratory created diamond—Growth technology and identification of HPHT & CVD diamonds", EGL USA booklet (2004).

W. Müller-Sebert et al., "Nitrogen Induced Increase of Growth Rate in Chemical Vapor Deposition of Diamond", Applied Physics Letters. vol. 68, No. 1, pp. 759-760 (1996).

W. Wang et al., "Gem-quality synthetic diamonds grown by a chemical vapor deposition (CVD) method", Gems & Gemology, 39, pp. 268-283 (2003).

X. Jiang et al., "The Coalescence of [001] Diamond Grains Heteroepitaxially Grown on (001) Silicon" Applied Physics Letters, vol. 69, No. 24, pp. 3902-3904 (1996).

Y. Liou et al., "The Effect of Oxygen in Diamond Deposition by Microwave Plasma Enhanced Chemical Vapor Deposition", J. Mater. Res., 5, pp. 2305-2312 (1990).

Yogesh K. Vohra et al., "Resonance Raman and photoluminescence investigations of micro-twins in homoepitaxially grown chemical vapor deposited diamond", Applied Physics Letters, vol. 71, No. 3, pp. 321-323 (1997).

G.A. Pasmanik et al., "Nonlinear Optics: Stimulated Raman scattering augments DPSS lasers" Laser Focus World, 35, pp. 137 (1999).

Pasmanik, "Stimulated Raman scattering augments DPSS lasers", Laser Focus World, Pennwell, Tulsa, OK, Nov. 1, 1999, pp. 137/138, 140, 142, 144.

Yan et al., "Development of the microwave plasma CVD technique for rapid growth of large single-crystal diamond", Plasma Science ICOPS, Jan. 1, 2006, pp. 359.

Yan et al., "Ultrahard diamond single crystals from chemical vapor deposition", Physica Status Solidi A Wiley-VCH Germany, 201(4): R-25 (2004).

* cited by examiner

LASER USES FOR SINGLE-CRYSTAL CVD DIAMOND

This application claims priority of provisional Application No. 60/897,838, filed on Jan. 29, 2007.

STATEMENT OF GOVERNMENT INTEREST

This invention was made with Government support under Grant No. EAR-0421020 awarded by the National Science Foundation. The Government has certain rights in this invention.

BACKGROUND OF THE INVENTION

1. Field of the Invention

The present invention relates to laser-related uses of diamond. More particularly, the present invention relates to laser-related uses of single-crystal diamond produced using Microwave Plasma Chemical Vapor Deposition (MPCVD) within a deposition chamber.

2. Description of Related Art

Diamond, in addition to its gem properties, is the hardest known material, has the highest known thermal conductivity, and is transparent to a wide variety of electromagnetic radiation. Diamond, with its high Raman frequency shift ($\Delta v=1332.5$ cm$^{-1}$) combined with very high Raman gain coefficient (g>15 cm·GW$^{-1}$) [G. A. Pasmanik, Laser Focus World 35, 137 (1999)], is also one of most interesting crystals for stimulated Raman scattering (SRS) generation. Monocrystalline (or single crystal) diamond in particular possess a wide range of important properties, including a low coefficient of thermal expansion, the highest known thermal conductivity, chemical inertness, wear resistance, low friction, and optical transparency from the ultra-violet (UV) to the far infrared (IR). Therefore, it is valuable because of its wide range of applications in a number of industries and research applications, in addition to its value as a gemstone.

For at least the last twenty years, a process of producing small quantities of diamond by chemical vapor deposition (CVD) has been available. As reported by B. V. Spitsyn et al. in "Vapor Growth of Diamond on Diamond and Other Surfaces", Journal of Crystal Growth, vol. 52, pp. 219-226, the process involves CVD of diamond on a substrate by using a combination of methane, or another simple hydrocarbon gas, and hydrogen gas at reduced pressures and temperatures of 800-1200° C. The inclusion of hydrogen gas prevents the formation of graphite as the diamond nucleates and grows. Growth rates of up to 1 µm/hour have been reported with this technique.

Subsequent work, for example, that of Kamo et al. as reported in "Diamond Synthesis from Gas Phase in Microwave Plasma", Journal of Crystal Growth, vol. 62, pp. 642-644, demonstrated the use of Microwave Plasma Chemical Vapor Deposition (MPCVD) to produce diamond at pressures of 1-8 kPa at temperatures of 800-1000° C. with microwave power of 300-700 W at a frequency of 2.45 GHz. A concentration of 1-3% methane gas was used in the process of Kamo et al. Maximum growth rates of 3 µm/hour have been reported using this MPCVD process. In the above-described processes, and in a number of other reported processes, the growth rates are limited to only a few micrometers per hour.

Recent efforts, however, have increased the growth rate, quality and size of the diamonds grown in an MPCVD process.

U.S. Pat. No. 6,858,078 to Hemley et al., which is hereby incorporated in its entirety by reference, is directed to an apparatus and method for diamond production.

U.S. application Ser. No. 11/438,260, filed May 23, 2006, which is hereby incorporated in its entirety by reference, is directed to producing colorless, single-crystal diamonds at rapid growth rate using Microwave Plasma Chemical Vapor Deposition (MPCVD) within a deposition chamber.

U.S. application Ser. No. 11/599,361, filed on Nov. 15, 2006, which is hereby incorporated in its entirety by reference, is directed to new uses for colorless, single-crystal diamonds produced at a rapid growth rate. The application is also directed to methods for producing single crystal diamonds of varying color at a rapid growth rate and new uses for such single-crystal, colored diamonds.

Until now, relatively few attempts have been made to use single-crystal diamond as a laser component.

U.S. Pat. No. 5,420,879, issued May 30, 1995, is directed to a solid state laser which includes synthetic diamond crystal as a medium of laser beam emission and generates a laser beam having a wavelength of 225 to 300 nm. The synthetic diamond crystal used in the invention is produced via a high pressure method, not by chemical vapor deposition.

U.S. Pat. No. 6,667,999, issued on Dec. 23, 2003, discloses a method and apparatus for cooling a high power laser oscillator or amplifier using diamond as an optically transparent heat transfer medium. The patent does not disclose the use of single crystal CVD diamond as a heat transfer medium.

U.S. Pat. No. 6,574,255, issued on Jun. 3, 2003, discloses external cavity optically-pumped semiconductor lasers that can include single crystal CVD diamond, but as a film.

Thus, there remains a need to develop new laser-based uses for single-crystal CVD diamonds.

SUMMARY

Accordingly, the present invention is directed to new laser uses of single-crystal CVD diamonds, including uses as a frequency converter.

Additional features and advantages of the invention will be set forth in the description which follows, and will be apparent, in part, from the description, or may be learned by practice of the invention. The objectives and other advantages of the invention will be realized and attained by the structure particularly pointed out in the written description and claims hereof, as well as the appended drawings.

To achieve these and other advantages and in accordance with the purpose of the present invention, as embodied and broadly described, an embodiment of the invention includes a laser comprising a diamond component, the improvement being that the diamond component comprises single-crystal CVD diamond.

In one embodiment, the diamond component is produced by a method comprising: controlling the temperature of a growth surface of the diamond such that the temperature of the growing diamond crystals is in the range of 900-1400° C., the diamond is mounted in a heat sink holder made of a material that has a high melting point and high thermal conductivity to minimize temperature gradients across the growth surface of the diamond, growing single-crystal diamond by microwave plasma chemical vapor deposition on the growth surface of a diamond in a deposition chamber having an atmosphere greater than 150 torr, wherein the atmosphere comprises from about 8% to in excess of about 30% $CH_4$ per unit of $H_2$.

In another embodiment, the heat sink holder used to produce the diamond comprises molybdenum.

In another embodiment, all temperature gradients across the growth surface of the diamond are less than about 30° C.

In another embodiment, all temperature gradients across the growth surface of the diamond are less than about 20° C.

In another embodiment, the single-crystal diamond is produced by a method further comprising the use of from about 5 to about 25% $O_2$ per unit of $CH_4$ in the deposition chamber atmosphere.

Specific uses for the single-crystal CVD diamond components in lasers can include heat sinks (or optically transparent heat transfer media), frequency converters, elaton's optical windows, Raman shifters, gain sources and other optical components.

Another embodiment of the invention is a $\chi^{(3)}$ nonlinear crystalline material for Raman laser converters comprising a single-crystal diamond.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION

Due to its extreme physical properties, such as high hardness and high thermal conductivity, synthetic diamond is used in many industrial and scientific applications. Given its high Raman frequency shift ($\Delta v=1332.5$ cm$^{-1}$) and a very high Raman gain coefficient (g>15 cm·GW$^{-1}$) [G. A. Pasmanik, Laser Focus World 35, 137 (1999)], diamond has the potential to be an excellent crystal for stimulated Raman scattering (SRS) generation. As confirmed in a soon to be published paper, single-crystal CVD diamond is potentially an effective stimulated Raman scattering (SRS) crystalline materials for Raman laser converters.

Reference to the detailed methods for producing the single-crystal CVD diamond used in the invention can be found in U.S. patent application Ser. No. 11/599,361, which, as discussed above, is incorporated herein by reference.

Figure 1:
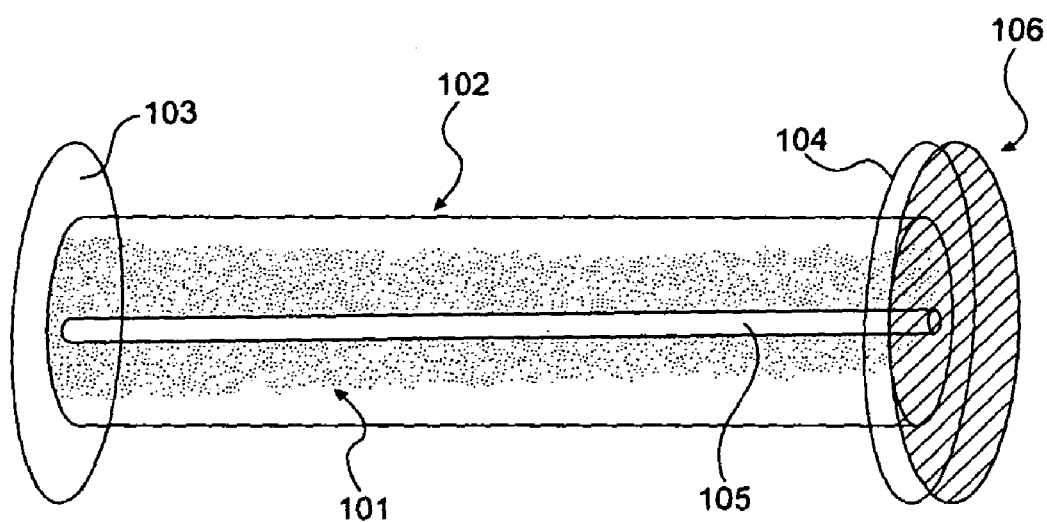
FIG. 1 is a cross-sectional view of a laser incorporating single-crystal CVD diamond as a heat sink.

The various embodiments of the invention will be described with respect to FIG. 1, which illustrates an embodiment of a pumped laser gain medium, which includes active laser medium 101 and mirrors 103 and 104. The laser is comprised of a gain medium and a resonant optical cavity. The gain medium transfers external energy 102 into the laser beam 105. Pump energy that is absorbed but not converted into laser energy becomes heat and must be removed. One or more heat sinks 106 are in thermal connection with the active laser medium to remove unused heat.

The active laser medium or gain medium 101 can be, for example, a solid state gain medium such as a Nd:YAG material or, in some embodiments, single crystal CVD diamond. In general, the heat flow path is substantially axial from the first surface of the laser gain medium 102.

As is known in the art, the action of pumping a laser gain medium with energy produces stimulated emission of laser energy within the laser gain medium. Because only a portion of the pumped energy received by the laser gain medium is used in the stimulated emission process, the energy absorbed but not used to promote stimulated emission produces heat within the laser gain medium. The heat generated within the laser gain medium can cause problems. Accordingly, it is important to dissipate the heat using a heat sink 106 that is optically and thermally coupled to the laser gain medium 102. The heat sink should be substantially optically transparent at both the lasing wavelength and the pump wavelength. Moreover, it should have a very high thermal conductivity compared to the active medium.

In one embodiment, heat sink 106 comprises single-crystal CVD diamond, a material which has the aforementioned desired properties.

The laser output is passed along the optical axis through heat sink 106, which does not absorb significant heat from the laser output since it is substantially transparent at the lasing frequency. Heat from the surface of the laser gain medium 102 is transferred via the heat sink to a heat exchanger for dissipation to cool the interior of the laser gain medium.

In other embodiments, single-crystal CVD diamond can be used as a heat sink in other types of lasers, including, but not limited to, thick disk lasers (e.g., ND:GGG, 100 kW or less thick disk lasers), zig-zag amplifiers (e.g., Nd and Yb: mostly YAG, around 5000 W), single-mode fiber lasers (e.g., mostly Yb: silica 1000 W single-mode fiber lasers), rod lasers (e.g., Nd and Yb: mostly YAG 1000 W rod lasers), and thin-disk amplifiers or lasers (e.g., Nd and Yb: mostly YAG, 2000 W). In a preferred embodiment, single-crystal CVD diamond is used as a heat sink material in a thin disk laser, which is readily cooled by a single-crystal CVD diamond.

Figure 2:
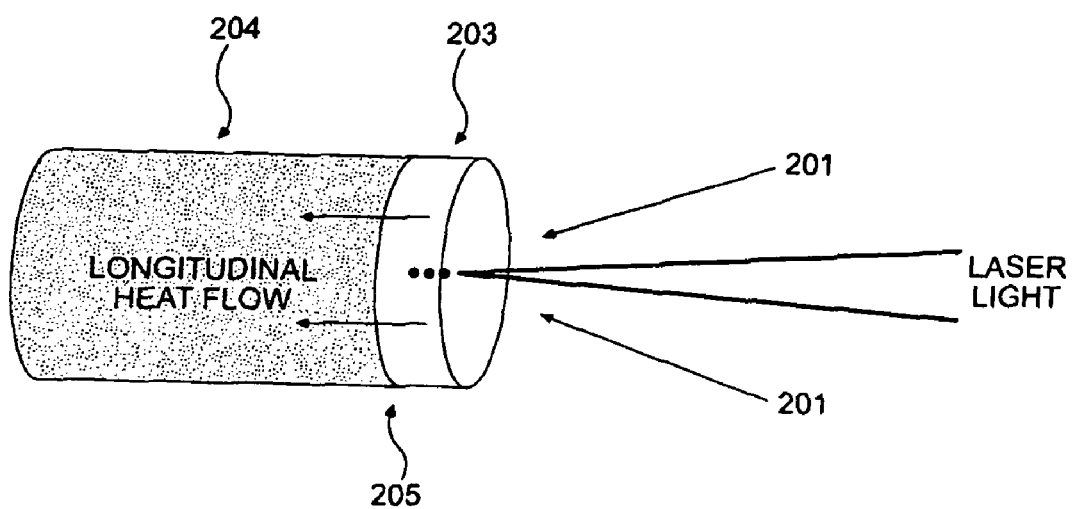
FIG. 2 is a schematic of a thin-disk laser head incorporating single-crystal CVD diamond as a heat sink.

FIG. 2 illustrates a thin-disk laser, which includes a laser crystal 203 that is considerably smaller than the laser beam wavelength, such that the generated heat is extracted primarily through one end face, i.e., in the longitudinal rather than the transverse direction. In one embodiment, the laser crystal 203 is, for example, a Yb:YAG disk with a thickness of about 100-200 μm. Heat sink 204 is thermally and physically connected to laser crystal 203. The cooled end face has a dielectric coating 205 which reflects both the laser radiation and the pump radiation. In other embodiments, another heat sink can be physically and thermally connected to laser crystal 203 at its other face.

The pump optics, which are not shown in FIG. 2 and which produce pump light 201, are arranged for multiple passes of the pump radiation. The heat is extracted in the longitudinal direction via the heat sink, thus minimizing thermal lensing effects. This results in good beam quality and stable operation.

In once embodiment of the invention, the heat sink comprises single-crystal CVD diamond.

In one embodiment, the one or more heat sinks comprise single-crystal CVD diamond produced in accordance with U.S. patent application Ser. No. 11/599,361.

Diamond produced by the methods disclosed in this application will be sufficiently large, defect free and transparent so as to be useful in lasers as, for example, windows and optical components, Raman shifters, gain source, laser emission media, gain media, heat sinks, frequency converters, and $\chi^{(3)}$ nonlinear crystalline material for Raman laser converters.

While the single-crystal diamond used in the above described laser uses can be produced in accordance with the methods disclosed in U.S. patent application Ser. No. 11/599, 361, it can also be produced according the other methods, including, for example, those disclosed in U.S. Pat. No. 6,858,078 and U.S. patent application Ser. No. 11/438,260.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

The invention claimed is:

1. In a laser including a diamond component, the improvement wherein the diamond component is a single-crystal CVD diamond comprising a heat sink optically and thermally coupled to a laser gain medium so as to absorb excess heat generated in said medium.

2. The laser of claim 1, wherein the single-crystal CVD diamond is produced by a method comprising:
   i) controlling the temperature of a growth surface of the diamond such that the temperature of the growing diamond crystals is in the range of 900-1400° C. and the diamond is mounted in a heat sink holder made of a material that has a high melting point and high thermal conductivity to minimize temperature gradients across the growth surface of the diamond and
   ii) growing single-crystal diamond by microwave plasma chemical vapor deposition on the growth surface of a diamond in a deposition chamber having an atmosphere greater than 150 torr, wherein the atmosphere comprises from about 8% to in excess of about 30% $CH_4$ per unit of $H_2$.

3. The laser of claim 2, wherein the heat sink holder comprises molybdenum.

4. The laser of claim 2, wherein all temperature gradients across the growth surface of the diamond are less than about 30° C.

5. The laser of claim 2, wherein all temperature gradients across the growth surface of the diamond are less than about 20° C.

6. The laser of claim 2, wherein the single-crystal diamond is produced by a method further comprising the use of from about 5 to about 25% O2 per unit of CH4 in the deposition chamber atmosphere.

\* \* \* \* \*